US009719870B2

(12) United States Patent
Caviglia et al.

(10) Patent No.: US 9,719,870 B2
(45) Date of Patent: Aug. 1, 2017

(54) READ CIRCUIT FOR POSFET TYPE TACTILE SENSOR DEVICES

(71) Applicant: FONDAZIONE ISTITUTO ITALIANO DI TECNOLOGIA, Genoa (IT)

(72) Inventors: Stefano Caviglia, Genoa (IT); Chiara Bartolozzi, Genoa (IT); Maurizio Valle, Loano (IT)

(73) Assignee: FONDAZIONE ISTITUTO ITALIANO DI TECNOLOGIA, Genoa (IT)

( * ) Notice: Subject to any disclaimer, the term of this patent is extended or adjusted under 35 U.S.C. 154(b) by 0 days.

(21) Appl. No.: 15/310,833

(22) PCT Filed: May 27, 2015

(86) PCT No.: PCT/IB2015/053952
§ 371 (c)(1),
(2) Date: Nov. 14, 2016

(87) PCT Pub. No.: WO2015/181732
PCT Pub. Date: Dec. 3, 2015

(65) Prior Publication Data
US 2017/0067786 A1    Mar. 9, 2017

(30) Foreign Application Priority Data

May 27, 2014   (IT) .............................. TO2014A0419

(51) Int. Cl.
*G01L 1/00*     (2006.01)
*G01L 1/16*     (2006.01)
(Continued)

(52) U.S. Cl.
CPC ................ *G01L 1/16* (2013.01); *G01D 5/244* (2013.01); *G01L 1/225* (2013.01); *H01L 41/042* (2013.01);
(Continued)

(58) Field of Classification Search
CPC ....... G01L 1/16; G01L 1/225; H03F 3/45475; H03F 3/45183; G01D 5/244; H01L 41/042; H01L 41/1132; H01L 41/193
(Continued)

(56) References Cited

U.S. PATENT DOCUMENTS 5,349,303 A     9/1994   Gerpheide
6,476,632 B1 *  11/2002  La Rosa ............ G01R 31/2824
                                                324/762.05
(Continued)

FOREIGN PATENT DOCUMENTS

EP          0363005 A      4/1990

OTHER PUBLICATIONS

Arnaud A et al: "Fully integrated signal conditioning of an accelerometer for implantable pacemakers", Analog Integrated Circuits and Signal Processing, vol. 49, No. 3, Sep. 11, 2006.
(Continued)

*Primary Examiner* — Max Noori
(74) *Attorney, Agent, or Firm* — Arent Fox LLP

(57) ABSTRACT

A read circuit of an electrical signal produced by a POSFET device comprising a transconductance amplifier connected at an inverting input thereof to the output of the POSFET device; and at least one neuron connected at the output to the transconductance amplifier. The transconductance amplifier is adapted to: receive a signal coming from the POSFET device representative of a force or pressure exerted on the POSFET device, and produce at the output at least one current signal representative of the force or the pressure. The
(Continued)

at least one neuron is adapted to receive said at least one current signal and to produce at least one output signal, said at least one output signal being a pulse train having a frequency proportional to said at least one current signal produced by the transconductance amplifier.

7 Claims, 3 Drawing Sheets

(51) Int. Cl.
    *G01D 5/244*     (2006.01)
    *H01L 41/04*     (2006.01)
    *H03F 3/45*      (2006.01)
    *G01L 1/22*      (2006.01)
    *H01L 41/113*    (2006.01)
    *H01L 41/193*    (2006.01)

(52) U.S. Cl.
    CPC ........ *H01L 41/1132* (2013.01); *H01L 41/193* (2013.01); *H03F 3/45183* (2013.01); *H03F 3/45475* (2013.01); *H03F 3/45744* (2013.01); *H03F 2203/45212* (2013.01); *H03F 2203/45288* (2013.01)

(58) Field of Classification Search
    USPC ................ 738/760, 777, 862.68; 324/762.05
    See application file for complete search history.

(56) References Cited

U.S. PATENT DOCUMENTS

| | | | | |
|---|---|---|---|---|
| 7,517,548 | B2* | 4/2009 | Araki ................ | C08F 14/22 427/255.11 |
| 9,606,606 | B2* | 3/2017 | Kitchens, II ......... | G06F 1/3215 |
| 2002/0179945 | A1* | 12/2002 | Sakamoto ......... | H01L 23/49562 257/288 |
| 2007/0109064 | A1 | 5/2007 | Micko | |
| 2016/0252411 | A1* | 9/2016 | Benaissa ............ | H01L 41/1132 73/862.68 |

OTHER PUBLICATIONS

Caviglia S et al: "Asynchronous, event-driven readout of POSFET devices for tactile sensing", 2014 IEEE International Symposium on Circuits and Systems (ISCAS), Jun. 1-5, 2014 Melbourne Australia.
Dahiya R S et al, "Development of Fingertip Tactile Sensing Chips for Humanoid Robots" 2009 IEEE International Conference on Mechatronics, Apr. 14-17, 2009, Malaga, Spain.
Indiveri G: "A low-power adaptive integrate-and-fire neuron circuit", International Symposium on Circuits and Systems, May 25-28, 2003, Bangkok, Thailand, 2003, pp. IV-820-IV-823.
International Search Report and Written Opinion for PCT/IB2015/053952 date of mailing Jan. 9, 2015.

* cited by examiner

READ CIRCUIT FOR POSFET TYPE TACTILE SENSOR DEVICES

The present invention relates to a read circuit for tactile sensor devices, in particular sensor devices that employ piezoelectric polymers as force and pressure transducers, directly coupled to field-effect transistor semiconductor devices for the conditioning of the local signal (POSFET, Piezoelectric Oxide Semiconductor Field Effect Transistor).

Tactile sensor devices of the POSFET type are known such as those described in the patent application TO2009A000269, granted on 24 Apr. 2012 with the number 1393585.

In the devices of the POSFET type, the electrical offset can be controlled by the mechanical stress or by the contact force imposed on the material on which the force (or pressure) is exerted. This effect is used to modulate the charge of the channel induced in the underlying field-effect device. Accordingly, the variation over time of the intensity of the mechanical stress (or contact force) is directly converted into the variation of the channel current of the POSFET device, in such a manner that it can be amplified and digitized.

Such sensor devices are arranged to thus produce at the output an analogue voltage/current proportional to the force (or pressure) exerted on them.

Tactile sensors are becoming ever more widespread devices in daily use.

In robotic applications, tactile sensors are important for the manipulation of objects and for enabling a safe interaction with the environment. Their development must satisfy various constraints that depend on the applications.

In humanoid robotics, such sensors must have a wide temporal frequency bandwidth in order to be able to respond to mechanical stresses with time responses that are also very fast and furthermore need to cover all the possible range of tactile stimuli, from the light touch necessary for example in order to appreciate the roughness of a surface, up to signals of greater intensity.

The sensors must be robust, well distributed and small, so as to be adaptable for example to the tip of the fingers of the robot and possibly cover their entire hand and body.

On the wider scale of the various technologies for the conversion of mechanical signals into electrical signals (resistive, capacitive, piezoelectric, optical, etc.), POSFETs have the advantage of being a "sensotronic" unit comprising transducers and transistors on the same substrate, and therefore capable of sensing and partially processing tactile signals on a single integrated device.

In this context, POSFETs may be compared with the mechano-receptors of the human skin which not only measure the contact parameters, but also partially process the tactile information.

The direct coupling of the sensitive material with electronic devices, such as in a POSFET, is advantageous because it allows a better signal-noise ratio, a faster response, a better sensitivity to the force (or pressure) to be measured and a high level of integration in systems in which the transducers and the electronic devices co-exist on the same substrate to be obtained, minimizing accordingly the final dimensions of the device.

In the tactile reception, where many tactile devices must be incorporated onto a robot, the high number of distributed sensitive elements (or "taxels") requires an efficient encoding of the tactile signals, which is able to minimize the transmitted data, transfer and store the results and enable their robust and reliable interpretation.

The tactile sensor devices of the POSFET type in the Patent application TO2009A000269 are able to supply at the output an analogue electrical signal (voltage/current) which, however, until today, is not acquired and processed in an efficient manner.

The aim of the present invention is thus to provide a read circuit for the electrical signal produced by tactile sensor devices of the POSFET type, which is capable of performing an efficient asynchronous encoding of such a received signal and of allowing a fast and efficient transmission of the data measured by the sensor.

This and other aims are achieved according to the present invention by means of a circuit according to Claim 1.

Particular advantageous embodiments of the present invention are objects of the dependant claims.

Further features and advantages of the present invention will become clearly apparent from the detailed description that follows, presented purely by way of non-limiting example, with particular reference to the appended drawings, in which.

Figure 1:
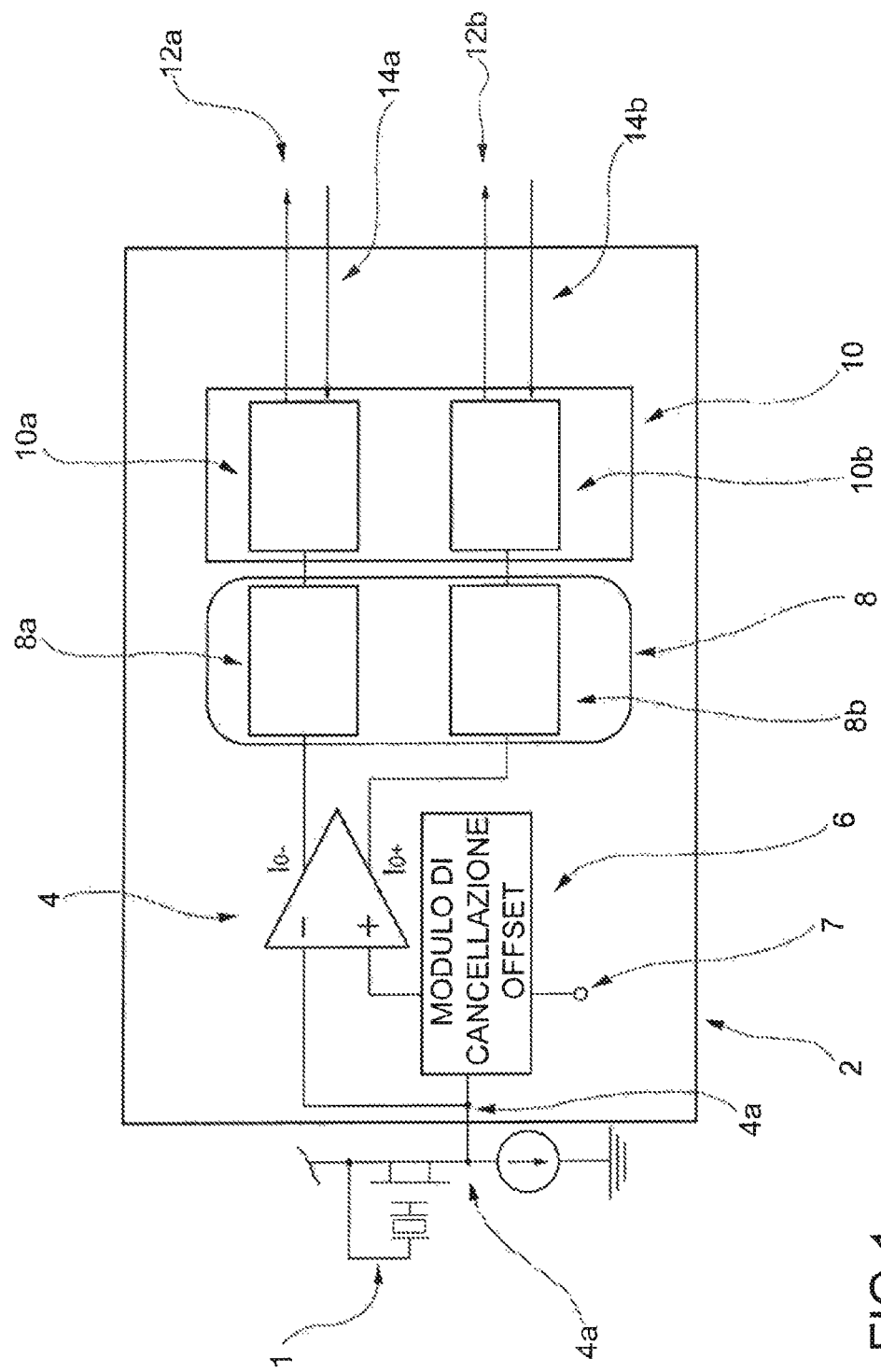
FIG. 1 is a block diagram of the read circuit of the present invention.

In FIG. 1, the reference 1 indicates a tactile sensor device of the POSFET type as described hereinabove.

The POSFET device is connected in a configuration of the source follower type with the bias current; the configuration is used for "buffering" (i.e. implementing an impedance matching) the output voltage.

The POSFET device 1 is connected to a read circuit 2, which comprises a transconductance amplifier 4 connected, via its inverting terminal, to the source terminal of the POSFET device 1 in a contact node 4a and connected, via the same contact node 4a, to an offset cancellation module 6 known per se.

The offset cancellation module 6 is connected in turn, as stated above, to the source terminal of the POSFET device 1 in the contact node 4a, and is furthermore connected to the non-inverting terminal of the transconductance amplifier 4.

The offset cancellation module 6 is arranged for generating, at the output, an offset output signal described in the following.

The offset cancellation module 6 has a further input 7 to which can be applied a control signal $V_{rst}$ (digital voltage signal) when necessary in order to carry out the operation for cancelling the offset.

The offset cancellation module 6 is necessary in order to solve the problems linked to the imperfections of the processes for fabricating the POSFET device 1, to the dispersion of the parameters of the electronic devices involved, such as also oscillations of the power supply voltage, and to the variations in temperature during normal use of the system.

If the offset cancellation module 6 is periodically activated, the effects of the variations of the operating point of the POSFET device 1, caused for example by low frequency interference such as electrostatic charges or variations in temperature, can be reduced.

In this way, the mechanical hysteresis, introduced by the non-linearity of the piezoelectric film of the POSFET device 1 and of the protection materials deposited on it, may also be controlled.

The transconductance amplifier 4 is connected at the output to a first and to a second neuron 8a, 8b (indicated overall with the reference 8) of the Leaky Integrate & Fire (LIF) type known per se and described in detail in the following.

The neurons 8a, 8b are connected at the output to an asynchronous arbitration circuit 10 of the AER (Address-Event Representation) type known per se and described in detail in the following.

This asynchronous arbitration circuit 10 is arranged to produce two output signals 12a, 12b directed toward a processor not shown in the figure and described in detail in the following.

The transconductance amplifier 4 is arranged, in a manner known per se, to compare, within a predetermined interval of time, the voltage coming from the POSFET device 1 (inverting input) with the value of the output voltage of the offset cancellation module 6 (non-inverting input). The output current $I_{0-}$ and $I_{0+}$ of the transconductance amplifier 4 (described in the following) are injected respectively into the first neuron 8a for the inverting output and into the second neuron 8b for the non-inverting output.

A wide range symmetric transconductance amplifier 4 (wide range symmetric OTA) is used with a double current output (as described here in the following) in order to obtain a compact read circuit 2 with cancellation of the offset.

Figure 2:
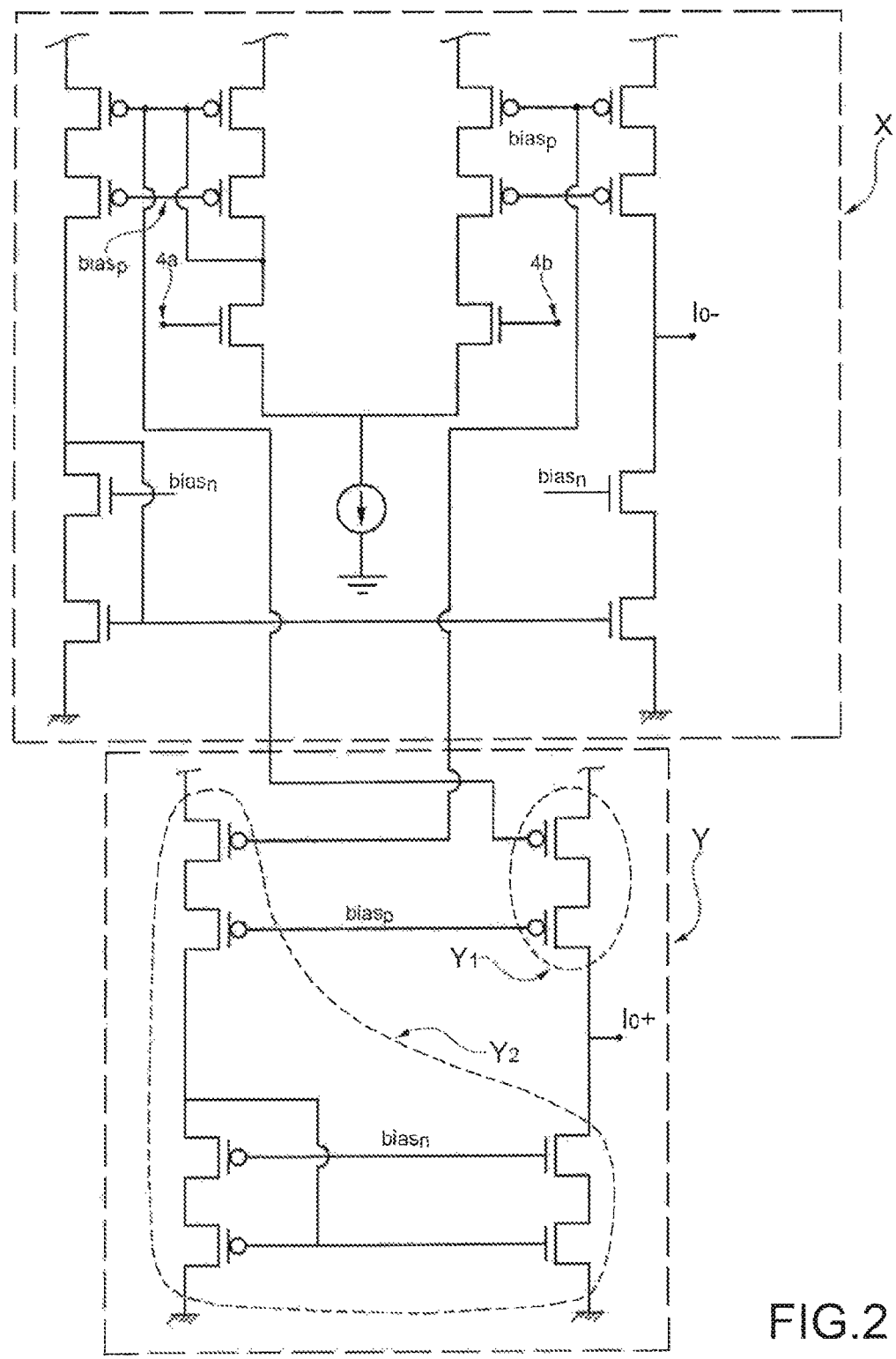
FIG. 2 is a circuit diagram of the transconductance amplifier of the circuit of the present invention.

The transconductance amplifier 4 is an amplifier of the OTA type known per se (thus having per se a single non-inverting output $I_{0+}$) to which, according to the present invention, has been added a further inverting output $I_{0-}$. FIG. 2 shows a circuit diagram of the transconductance amplifier 4 in which the components enclosed by the line X are the components of a standard OTA, whereas in the area enclosed by the line Y are shown the current mirrors Y1 and Y2 which have been added in order to in the end obtain the inverting output $I_{0-}$. The operation of the current mirrors Y1, Y2, etc. is known per se and will not be described further here.

The operation of the circuit 2 described hereinabove will now be described.

As stated above, the POSFET device 1 is arranged to generate at the output, on the source terminal, an analogue voltage signal whose intensity is proportional to the force (or pressure) exerted on it. This voltage signal is thus present in the first contact node 4a and is supplied to the inverting input of the transconductance amplifier 4.

A contact node 4b (see FIG. 2), which corresponds to the non-inverting input of the transconductance amplifier 4, is connected to the output of the offset cancellation module 6.

Figure 3:
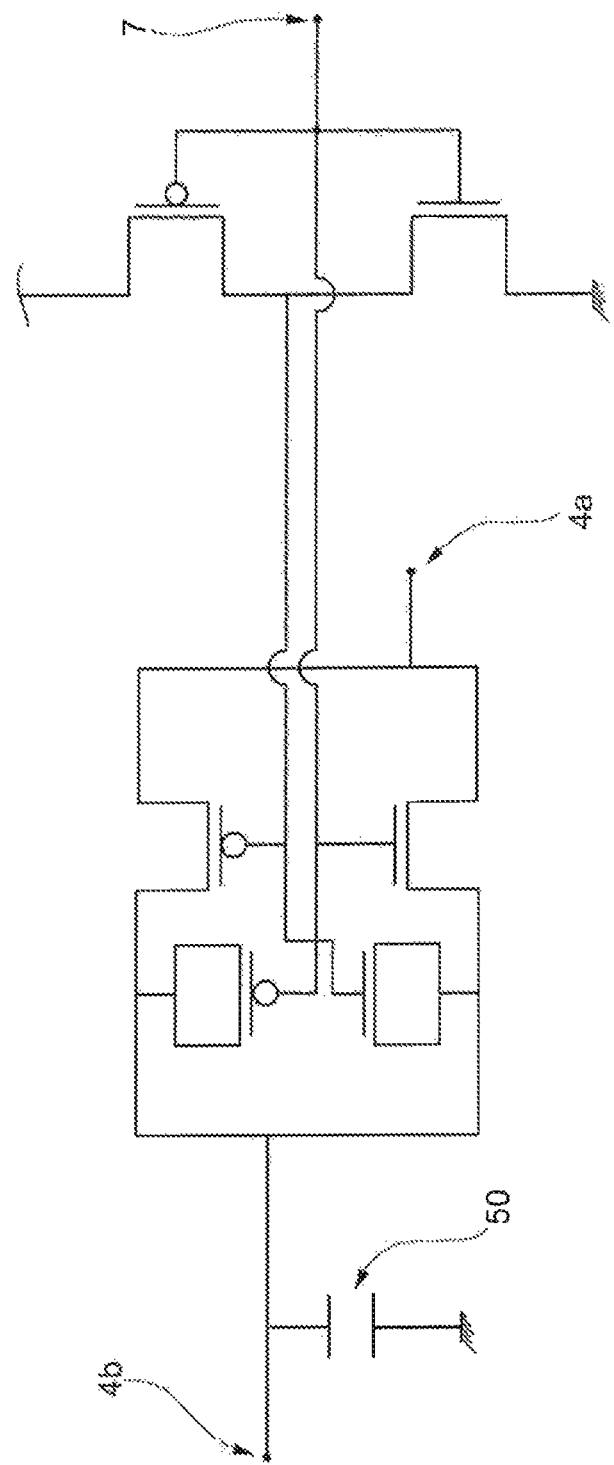
FIG. 3 is a circuit diagram of the offset cancellation module.

FIG. 3 shows a circuit diagram of the offset cancellation module 6 which is formed in a manner known per se by a switch realized by a transfer-gate CMOS with dummy switch, which allows to implement a switch controlled by the control signal $V_{rst}$. On the output terminal of the offset cancellation module 6, corresponding to the contact node 4b, a capacitor 50 coupled to ground is present which stores the voltage signal coming from the POSFET device 1 and thus the offset of the same POSFET device 1. This stored voltage signal is the aforementioned offset output signal, and is thus representative of the voltage value of the POSFET device 1 at the moment in which the control signal $V_{rst}$ arrives.

When the control signal $V_{rst}$ applied externally to the input 7 of the offset cancellation module 6 is low (the term "low" makes reference to the standard terminology for digital signals for which it corresponds to the logical value "zero", where in this case, "zero" is for example included in the interval [0-1.65]V or it corresponds to ground potential), the offset cancellation module 6 behaves as an open switch, and the non-inverting terminal of the transconductance amplifier 4 is not connected in a manner known per se to the source of the POSFET device 1 (in the first contact node 4a).

This causes the isolation of the non-inverting terminal of the transconductance amplifier 4, and thus also the isolation of the capacitor 50 of the offset cancellation module 6, by the signal coming from the POSFET device 1. The voltage present on the ends of the capacitor 50 thus remains constant for the whole time in which the control signal $V_{rst}$ remains low, allowing the transconductance amplifier 4 to perform the subtraction between the voltage signal coming from the POSFET device 1 and the voltage present on the ends of the capacitor 50 (thus generating the output current $I_{0+}$, $I_{0-}$), thus obtaining the cancellation of the offset due to the POSFET device 1 at the input to the transconductance amplifier 4.

The output signals from the transconductance amplifier 4 (the outputs $I_{0+}$, $I_{0-}$) are current signals and have an amplitude proportional to the difference of the input voltages, such a difference being proportional to the force (or pressure) exerted on the POSFET device 1.

When the value of the control signal $V_{rst}$ applied externally to the input 7 of the offset cancellation module 6 is set at a "high" level (the term "high" makes reference to the standard terminology for the digital signals for which it corresponds to the logical value "one", where in this case "one" is for example included within the interval [1.65-3.3]V or it corresponds to the power supply voltage), the offset cancellation module 6 behaves as a closed switch, the inverting and non-inverting terminals of the transconductance amplifier 4 are connected together in a manner known per se, and are then connected to the source of the POSFET device 1 (in the first contact node 4a).

In this way, it is possible to store the value of the signal in voltage by the POSFET device 1 on the ends of the capacitor 50 contained in the offset cancellation module 6, updating the value of offset which it is intended to eliminate from the signal in current at the output from the transconductance amplifier 4.

In this configuration, the voltage between the contact nodes 4a and 4b, which coincide with the inverting and non-inverting inputs of the transconductance amplifier 4, is zero, thus forcing a zero current at the output to the transconductance amplifier 4 (thus, it is as if the output current $I_{0+}$, $I_{0-}$ had not been generated).

Returning now to FIG. 1, the neurons 8 comprise two neurons of the LIF type, the first neuron 8a being predisposed for receiving at the input the inverting output $I_{0-}$ from the transconductance amplifier 4 and the second neuron 8b being predisposed for receiving at the input the non-inverting output $I_{0+}$ from the transconductance amplifier 4.

The transconductance amplifier 4 is obtained by applying the modification indicated above to a symmetric OTA because the neurons 8a, 8b, per se, are rectifying and only respond to a positive current coming from the transconductance amplifier 4, that is they only respond to mechanical stimuli of compression (e.g. the applied force/pressure increases) or of release (the applied force/pressure decreases).

Wishing to observe the entire range of variation of the current (and of the related mechanical stimulus applied to the POSFET device 1), the two neurons 8a, 8b indicated above have thus been introduced, in such a manner that one can analyze the positive variations and the other the negative variations of the voltage coming from the POSFET 1. For the negative variations, it is thus necessary to obtain a current signal of opposite polarity to be supplied to the second neuron 8b.

The neurons 8a, 8b are connected to the asynchronous arbitration circuit 10, which comprises two arbitration sub-circuits, respectively a first arbitration sub-circuit 10a and a second arbitration sub-circuit 10b, each connected to the respective neuron 8a, 8b.

Each neuron 8a, 8b is an electronic circuit known per se adapted to receive the respective output current $I_{0-}$, $I_{0+}$ of the transconductance amplifier 4 (thus, adapted to receive a current signal coming from the transconductance amplifier 4 and represented by the respective output $I_{0+}$, $I_{0-}$), and to forward it, after having processed it in a manner known per se, to the associated arbitration sub-circuit 10a, 10b. At the output from each neuron 8a, 8b, an intermediate pulse train (intermediate signal) is thus obtained whose frequency is proportional to the absolute value of the current coming from the transconductance amplifier 4.

Each arbitration sub-circuit 10a, 10b is an electronic circuit known per se adapted to receive at the input:
the intermediate signal coming from the associated neuron 8a, 8b, and
a respective second input signal 14a, 14b (known as an acknowledgement signal) coming in a manner known per se from an external arbitration circuit not shown in the figure. As an alternative to using an external arbitration circuit it is possible, in a manner known per se, to short-circuit the output with the input of the asynchronous arbitration circuit 10 (namely, to short-circuit, respectively, the output signals 12a and 12b with the acknowledgement signals 14a and 14b), in the case of a single taxel.

Each time that the intermediate signal produced by the neurons 8a or 8b is served (and thus, sent outside of the read circuit 2 over an asynchronous bus), the neurons 8a and 8b are reset and begin a new read cycle.

Each arbitration sub-circuit 10a, 10b is thus capable of generating, in a manner known per se starting from the two received signals, the respective output signals 12a, 12b, the said output signals 12a, 12b being pulse trains having a frequency directly proportional to the absolute value of the input current received at each respective neuron 8a, 8b. The output signals 12a and 12b are digital signals.

The output signals 12a, 12b are thus proportional to the values of the current signals coming from the transconductance amplifier 4.

The pulse trains obtained at the output are therefore proportional to the value of force (or pressure) exerted on the POSFET device 1.

The neurons 8a, 8b thus carry out, together with the respective arbitration sub-circuit 10a, 10b, an analogue-digital conversion of the output signal from the POSFET device 1 encoding the force (or pressure) measured by the piezoelectric material and read by the underlying field-effect device into a train of digital pulses.

The asynchronous arbitration circuit 10, together with the external arbitration circuit, manage the collision between contemporaneous pulse trains coming from various taxels on a single chip and forward the pulses to an external bus, together with the identity of the corresponding taxel, implementing the conventional asynchronous communications scheme of the known "Address-Event Representation" (AER) protocol. In particular, the asynchronous arbitration circuit 10 blocks the production of the intermediate signals from the neurons 8a and 8b until the external arbitration circuit does not forward the corresponding event at the output over the external bus.

In one variant of the present invention, the control signal $V_{rst}$ for the cancellation of the offset is not arbitrarily supplied externally (obtaining in this way a frequency of the output signals 12a, 12b proportional to the absolute value of the force or pressure generated on the POSFET device 1) but performs a logic OR between the acknowledgment signals 14a and 14b and the external signal, and the result of this operation is supplied to the input 7 of the offset cancellation module 6.

In this way, it is possible to encode the variations of force (or pressure) exerted on the POSFET device 1 rather than their absolute value, acquiring and sending the data on only when the force (or the pressure) on the POSFET device 1 varies.

This strategy adapts the system composed of the POSFET device 1 and of the read circuit 2 to the real dynamics of the external world, and directly removes the redundancies during the phase for conversion of the physical quantity (force or pressure) into digital signal (the output signal 12a, 12b).

If the physical quantity measured by the POSFET device 1 does not change, nothing is transmitted, stored and processed. In the opposite case, the exchange of asynchronous data ensures that when there is a variation, this is immediately communicated to the external processor.

The read circuit 2 of the present invention guarantees a very high time resolution and a low latency, together with the transmission of a reduced quantity of data and with an efficient use of the resources.

The analogue signals coming from the POSFET device 1 are thus digitized in an asynchronous manner in a non-conventional way: using a neuromorphic system, the data are encoded with digital pulses which can be transmitted in a robust manner, and the information is contained in the frequency of the pulses (InterSpike Interval).

The output digital waveform from the read circuit 2 is a stream of digital pulses whose frequency encodes the mechanical input, in particular the amplitude of the mechanical input signal or the change in this amplitude. The analogue information on the amplitude of the analogue signal coming from the POSFET device 1 is encoded in the relative timing of the pulses (the pulse train is modulated with a time between pulses that is inversely proportional to the amplitude of the analogue signal coming from the POSFET). The intrinsically managed encoding of the data optimizes its transmission by removing the redundant information when the input signal is not changing.

In the electronic systems with matrices of transducers, where there is a limit to the number of connections and to the usable external wires, the speed of communication is obtained by sub-dividing the asynchronous pulses over time (time-multiplexing) on a single bus. In the case of integrated tactile sensors, each "taxel" sends out its own pulse onto the bus whenever it is mechanically stressed, and the digital pulse is sent out together with the identity (or address) of the corresponding "taxel" encoded as a digital word. This AER protocol has become a standard in the sector, since it allows various sensors and processing devices to communicate with one another in order to form neuromorphic sensor systems.

The circuit of the present invention allows a time-multiplexing of the analogue signals coming from a matrix of POSFET devices making use of the AER protocol for transmitting the information from multiple sensors over a single channel, and it is suited to the integration of a large quantity of distributed tactile sensors.

In sensorized applications for electronic skin, for example in robotics, where there is a high number of distributed sensors that measure activities localized both spatially and temporally in a diverse manner, the tactile sensors managed with an AER methodology offer a low power and compact solution.

Further advantages of the present invention are as follows:

for the first time, a tactile device with a fully-integrated read circuit has been implemented; the read circuit of the present invention carries out an analogue-digital conversion based on the amplitude or variation of the analogue signal, minimizing the transmission of data with respect to the conventional synchronized-time sampling.

It goes without saying that, still keeping the principal of the invention, the embodiments and their implementations could be significantly varied with respect to what has been described and illustrated purely by way of non-limiting example, without however straying from the scope of protection of the present invention defined by the appended claims.

The invention claimed is:

1. A read circuit of an electrical signal produced by a POSFET device comprising:
   a transconductance amplifier connected at an inverting input thereof to the output of the POSFET device;
   at least one neuron connected at the output to the transconductance amplifier;
   said transconductance amplifier being adapted to:
      receive a signal coming from the POSFET device representative of a force or pressure exerted on the POSFET device, and
      produce at the output at least one current signal representative of the force or the pressure;
   said at least one neuron being adapted to receive said at least one current signal and to produce at least one output signal, said at least one output signal being a pulse train having a frequency proportional to said at least one current signal produced by the transconductance amplifier.

2. A read circuit according to claim 1, further comprising at least one asynchronous arbitration circuit connected at the output to said at least one neuron, in which
   said at least one neuron is arranged to produce at least one intermediate signal proportional to an absolute value of the current signal; and
   said at least one asynchronous arbitration circuit is adapted to receive said at least one intermediate signal and at least a second input signal and to generate, on the basis of said at least one intermediate signal and said at least the second input signal, said at least one output signal.

3. A read circuit according to claim 2, further comprising an offset cancellation module connected to a non-inverting input of the transconductance amplifier and connected to the output of the POSFET device,
   said offset cancellation module being adapted to
      receive a control signal in order to carry out an operation for cancelling the offset of the POSFET device, and to
      form, at the input to the transconductance amplifier, an open switch or a closed switch depending on the value of the control signal, in such a manner that the transconductance amplifier generates or not, at the output, at least the current signal.

4. A read circuit according to claim 3, in which the transconductance amplifier is adapted to produce at the output at least one current signal via a comparison between the signal coming from the POSFET device within a predetermined interval of time and an offset output signal coming from the offset cancellation module, said offset output signal being the signal produced by the POSFET device within an instant of time preceding said first interval and stored in memory by the offset cancellation device.

5. A read circuit according to claim 1, in which the transconductance amplifier is an OTA amplifier of the OTA type furthermore comprising and further comprises two current mirrors adapted to generate an inverting output.

6. A read circuit according to claim 1, further comprising an offset cancellation module connected to a non-inverting input of the transconductance amplifier and connected to the output of the POSFET device,
   said offset cancellation module being adapted to
      receive a control signal in order to carry out an operation for cancelling the offset of the POSFET device, and to
      form, at the input to the transconductance amplifier, an open switch or a closed switch depending on the value of the control signal, in such a manner that the transconductance amplifier generates or not, at the output, at least the current signal.

7. A read circuit according to claim 6, in which the transconductance amplifier is adapted to produce at the output at least one current signal via a comparison between the signal coming from the POSFET device within a predetermined interval of time and an offset output signal coming from the offset cancellation module, said offset output signal being the signal produced by the POSFET device within an instant of time preceding said first interval and stored in memory by the offset cancellation device.

* * * * *